March 12, 1968 P. W. BLACK 3,373,379

CRYSTAL OSCILLATOR WITH TEMPERATURE COMPENSATION

Filed June 17, 1966

INVENTOR
Paul W. Black

BY

Mueller, Aichele & Rauner

ATTYS.

United States Patent Office 3,373,379

Patented Mar. 12, 1968

3,373,379

CRYSTAL OSCILLATOR WITH TEMPERATURE COMPENSATION

Paul W. Black, Harvey, Ill., assignor to Motorola, Inc., Franklin Park, Ill., a corporation of Illinois Filed June 17, 1966, Ser. No. 558,310
5 Claims. (Cl. 331—116)

ABSTRACT OF THE DISCLOSURE

Transistorized crystal oscillator of the Colpitts type with temperature compensating capacitors connected in parallel with the crystal to compensate the linear variation in frequency of the crystal with temperature. A varactor is connected in series with the crystal and a control voltage is applied to change the capacity thereof. The control voltage may be provided by voltage dividers including thermistors so that the capacity changes with temperature and compensates the frequency of the oscillator at the edges of the temperature range.

This invention relates generally to crystal oscillator circuits, and more particularly to a transistorized crystal oscillator circuit having temperature compensating means so that the variation in frequency is held within very close limits throughout a wide temperature range.

In radio apparatus, it is common practice to use crystal oscillators to provide accurate control of the frequency of operation. Piezoelectric resonators such as quartz crystals have been used for this purpose but have the disadvantage that the frequency changes with temperature. To overcome this problem heated ovens have been used for the crystals to hold the frequency within very narrow limits over a wide temperature range. Although this has been generally satisfactory for fixed station use where there is adequate space for the oven and the power required for energizing the same is not critical, it has not been satisfactory for compact equipment. Many compact units have self-contained batteries or derive power from a vehicle, and it is highly desirable that the power consumption be held to a minimum so that a small battery can be used, and/or a long battery life is provided. The use of crystal ovens is also objectionable in that a certain warm up time is involved, and crystals operating with elevated temperatures tend to deteriorate at a greater rate than crystals at lower temperatures.

Various temperature compensating circuits have been proposed to eliminate the need for crystal ovens. These have included thermistors and temperature sensitive capacitors. However, the circuits which have been proposed have not been sufficiently stable and accurate for use in many applications. Also, these have been difficult to align and have presented various maintenance problems.

It is, therefore, an object of the present invention to provide an improved crystal oscillator circuit which compensates for variations in frequency of the crystal with temperature over a wide range of temperatures.

Another object of the invention is to provide a temperature compensated oscillator circuit which holds the frequency of the oscillator within very narrow limits over a frequency range extending from −30° to +85° centigrade.

A feature of the invention is the provision of a crystal oscillator including a transistor connected in a circuit of the Colpitts type having capacitors whose value varies with temperature for compensating for the linear frequency variation of the crystal with temperature. The circuit may include a varactor with temperature responsive circuits coupled thereto for compensating for frequency variations at temperatures at the edges of the temperature range so that the overall response has very small variations over an extremely wide temperature range.

Another feature of the invention is the provision of a Colpitts type oscillator having a transistor and a crystal for controlling the frequency thereof, with at least one capacitor having a temperature coefficient of opposite polarity to the temperature coefficient of the crystal, and a varactor in series with the crystal to which voltages are applied through diodes by a pair of voltage dividers, with each voltage divider having a thermistor for changing the voltage applied thereby with temperature so that one diode will conduct at high temperatures to reduce the frequency of the oscillator and the other diode will conduct at low temperatures to increase the frequency of the oscillator. The circuit of the invention has been found to provide a frequency which varies less than 2 parts per million through the temperature range between −30° and +85° Centigrade.

The invention is illustrated in the drawing wherein.

Figures 1, 2:
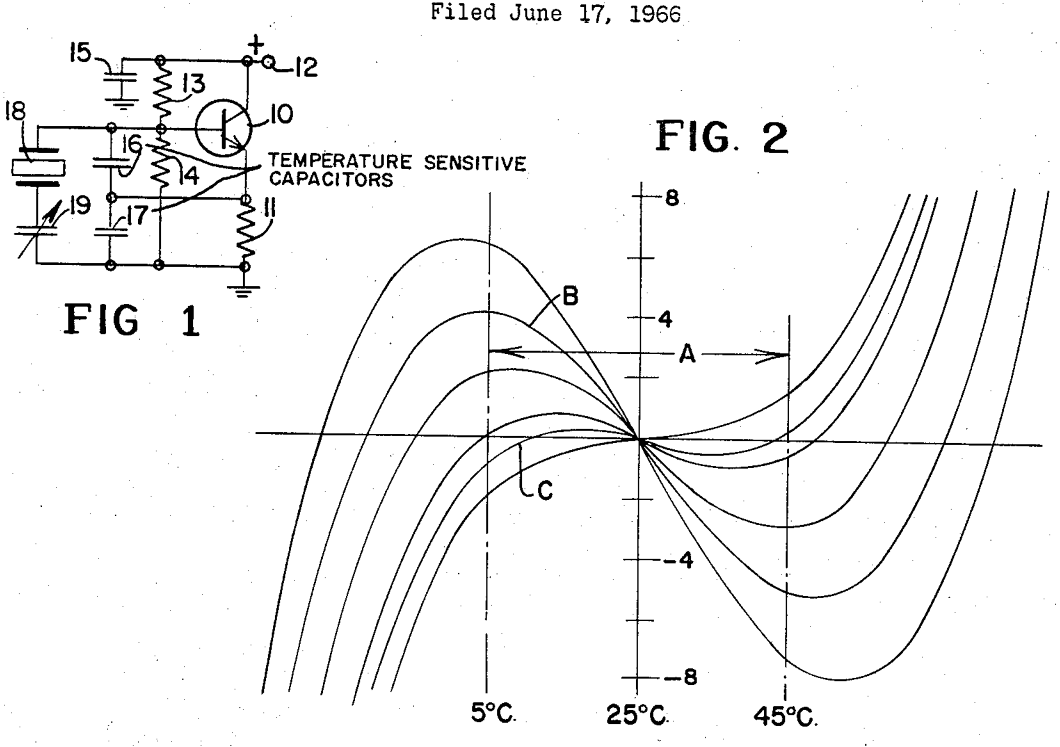
FIG. 1 is the circuit of a transistorized Colpitts crystal oscillator in accordance with the invention having compensation for the linear variation in frequency of the crystal.
FIG. 2 is a set of curves illustrating the variation in frequency of different crystals with temperature.

In practicing the invention, a crystal oscillator of the Colpitts type is provided with the capacitors of the oscillator circuit having temperature coefficients to correct for the linear variation of the crystal frequency with temperature. The two capacitors which form a voltage divider in the normal Colpitts oscillator circuit may both have non-linear temperature characteristics, or only one of these capacitors may have such a characteristic. The capacitors are used to reduce the linear variation in frequency of the crystal, although it is unnecessary that the linear variation be completely compensated for. A varactor diode and a variable condenser in parallel with each other are connected in series with the crystal. A normal voltage is applied to the varactor diode by a voltage divider which provides a given capacity in the center region of the operating temperature range. A pair of additional voltage dividers are provided each including a thermistor so that the voltage produced thereby changes with temperature. One voltage divider provides an increase in voltage as the temperature drops and when a particular voltage is reached, a coupling diode is rendered conductive to increase the voltage applied to the varactor. The other voltage divider provides an output voltage which is reduced with increase in temperature, and when the voltage drops to a particular point, the coupling diode breaks down so that the reduced voltage is applied to the varactor. The two voltage dividers, therefore, provide potentials to the varactor to change the capacity thereof, and thereby compensate the circuit at the edges of the temperature range over which the circuit operates.

Referring now to the drawing, the oscillator circuit includes a transistor 10, the emitter of which is connected to ground through resistor 11. A positive potential is applied from terminal 12 to the collector electrode, and a smaller positive potential is applied to the base electrode by the voltage divider including resistors 13 and 14. The collector electrode is bypassed by capacitor 15. Capacitor 16 is connected between the base and emitter electrodes of the transistor, and capacitor 17 is connected between the emitter electrode and ground. Since the collector electrode is at ground for alternating current, the capacitor 17 is effectively between the emitter and collector electrodes. Connected across the capacitors 16 and 17 is a piezoelectric resonator or crystal 18 in series with capacitor 19. Capacitor 19 is variable to compensate the circuit for the characteristics of the crystal 18.

FIG. 2 is a chart including a family of curves indicating the variation in frequency with temperature of crystals having an AT cut. It will be noted that the central portion of the characteristics, designated A, have a substantially linear frequency variation with temperature. This variation is centered at about 25° C. and is substantially linear from 5° C. to 45° C. The temperature characteristic then has a higher order variation which causes the frequency to return and extend sharply in the opposite polarities at both ends of the temperature range. The characteristics of individual crystals differ only as to the linear variation, and this is represented by the different curves shown in FIG. 2.

The linear variations in the frequency response of the crystal with temperature can be compensated for in the circuit of FIG. 1 by the capacitors 16 and 17. In the circuit shown, the capacitor 17 will have a substantially larger impedance than the capacitor 16, and it will therefore have a greater effect on the temperature characteristics. The capacitors 16 and 17 can be selected with different characteristics depending upon the characteristics of the individual crystal used in the circuit. Since the capacitor 17 has a greater effect, this can be selected to provide the majority of the compensation and the capacitor 16 can be selected for a more precise correction providing in effect a vernier action.

The overall response with the linear correction will follow the family of curves shown in FIG. 2. It is possible to compensate the linear variations so that it is substantially removed, or to reverse the polarity of the linear variation. Normally it is preferable to provide a slightly negative linear variation since the characteristic reverses as the temperature changes further in either direction from the center point. For example, a crystal having a response represented by the curve B in FIG. 2 can be compensated so that the response is as shown by curve C.

Although the crystals will nomally have a negative temperature characteristic, as shown by the curves in FIG. 2, some crystals may have a slightly positive characteristic. To provide compensation, the capacitors must have the same temperature characteristic as the crystal. Therefore, the use of compensating capacitors having a negative temperature characteristic will be required to compensate for crystals having a negative characteristic. Although capacitors of any type which have the desired temperature characteristic can be used, commercially available ceramic disc type capacitors have been found to be satisfactory.

Figure 3:
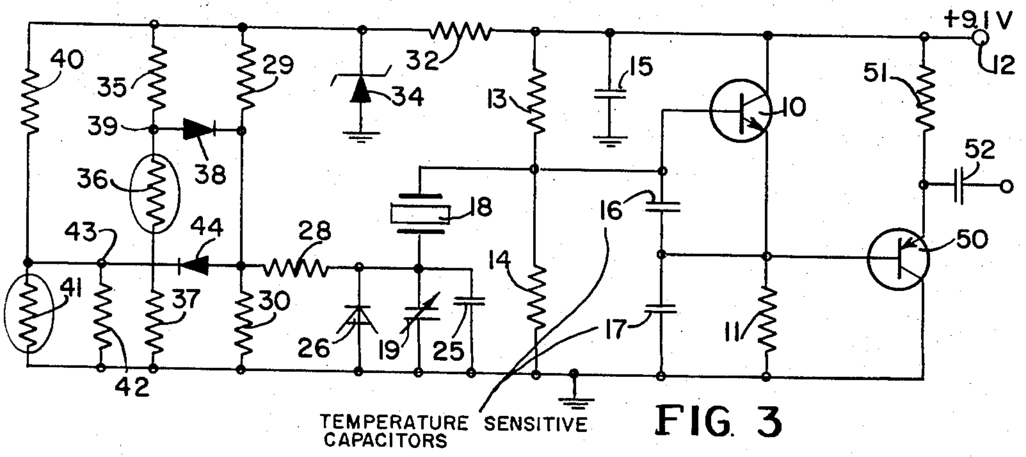
FIG. 3 is a circuit diagram of a crystal oscillator including compensation for the linear variation in frequency with temperature as well as compensation for higher order correction at the edges of the temperature range.

FIG. 3 shows a crystal oscillator circuit of the same type as shown in FIG. 1, but with further compensating and output circuitry. The transistor 10, capacitors 16 and 17, crystal 18 and variable capacitor 19 function in exactly the same way as in FIG. 1. Also, the load resistor 11, bias resistors 13 and 14 and bypass capacitor 15 provide the same operation as has been described. The capacitors 16 and 17 can be selected to have temperature characteristics which compensate for the linear variation in frequency of crystal 18, as has been described.

Connected in parallel with the variable capacitor 19 is a fixed capacitor 25 and a varactor diode 26. The capacity of the varactor diode 26 varies with the bias potential applied thereacross. This bias potential is applied by resistor 28 which is connected to the voltage divider including resistors 29 and 30. Operating voltage is applied to the voltage divider from terminal 12 through the regulator including series resistor 32 and zener diode 34. Since a fixed voltage is developed across the zener diode 34, the resistors 29 and 30 will provide a fixed voltage through resistor 28 which completes the circuit to the varactor diode 26.

Connected in parallel with the voltage divider including resistors 29 and 30 are two other voltage dividers, the first including resistors 35, 36 and 37 and the second including resistors 40, 41 and 42. The resistor 36 is a negative temperature coefficient thermistor so that the resistance thereof and the voltage developed thereacross rises as the temperature drops. Diode 38 coupled from point 39 to the resistor 28 is normally non-conducting, but when the temperature drops to a particular value, the resistance of thermistor 36 will increase and the voltage applied to the diode 38 will cause it to conduct, so that the voltage applied to the varactor 26 will increase. This will cause the capacity of the varactor to decrease which will compensate for the sharp decrease in oscillator frequency at low temperatures.

Resistor 41 is also a negative temperature coefficient thermistor, and the voltage divider including thermistor 41 will normally provide a potential at point 43 to hold the diode 44 non-conducting. As the temperature increases, the resistance of the thermistor 41 will decrease so that the voltage thereacross decreases and the voltage at point 43 is less. The diode 44 will conduct when the voltage at point 43 drops below the voltage provided by the divider 29, 30 to lower the potential applied to the varactor 26. This will cause the capacity of the varactor to increase to thereby reduce the frequency of the oscillator and thereby compensate for the increase in frequency of the crystal at increased temperatures.

An emitter follower is used for coupling the oscillator to a load and for isolating the oscillator from the load. The emitter follower includes transistor 50 having its base electrode connected to the resistor 11. The emitter electrode is connected through resistor 51 to the positive potential point, which is connected to the collector of transistor 10 of the oscillator. The output voltage derived at the emitter of transistor 50 is coupled through capacitor 52 to the output terminal. The emitter follower provides effective isolation so that change in load does not change the oscillator frequency.

Figure 4:
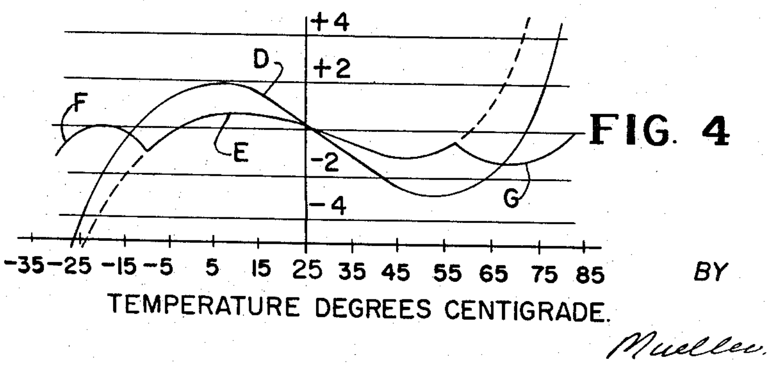
FIG. 4 is a curve illustrating the characteristics of the circuit of FIG. 3.

FIG. 4 shows the frequency-temperature characteristics of the oscillator circuit of FIG. 3. The curve marked D shows the variation in frequency of the crystal with temperature change, independent of the compensation provided by the oscillator circuit. The curve shown is for an AT crystal having a very good frequency-temperature characteristic. Curve E shows the response after the linear compensation, and the portion of the characteristic between −10° and +57° C. is compensated only by the temperature characteristics of the capacitors 16 and 17. When the temperature drops below −10° C., the crystal causes a large variation in frequency as indicated by the dotted extension of the portion E. In this temperature range, thermistor 36 has a sufficiently high resistance to provide a voltage at point 39 such that the diode 38 conducts. This raises the voltage applied to the varactor 26 so that the capacity thereof drops, and the frequency of the oscillator circuit rises. This provides the portion F of the response curve which extends down to −30° C. Similarly, when the temperature rises above +57° C., the frequency of the oscillator tends to rise sharply. At such temperature, thermistor 41 has a lower resistance so that the voltage at point 43 drops to a value such that diode 44 conducts. This reduces the voltage applied to the varactor 26 and the capacity thereof rises, and the oscillator frequency drops. This provides the portion G of the response curve which extends between +57° and +85° C.

It will be apparent from FIG. 4 that the sections E, F and G provide an overall response between −30° and +85° C. wherein the variation from the center frequency is only from +.5 to −1.5 parts per million. The total variation in frequency, therefore, is only 2 parts per million over this wide frequency range.

The crystal oscillator circuit which has been described has been found to operate over a wide temperature range and provide an output frequency which has very small variations from the center frequency. Variations of only 2 parts per million have been obtained over the temperature range from −30° centigrade to +85° centigrade. The circuit required is relatively simple and easy to align, and includes a voltage regulator so that it is not sensitive to supply voltage variations. The compensation for the linear frequency-temperature variation is effective to take care of the variation which is peculiar to the individual crystals. The compensation for the frequency variation at the ends of the temperature range can, therefore, be substantially the same for all crystals.

I claim:

1. An oscillator of the Colpitts type including in combination, a transistor having base, emitter and collector electrodes, and frequency controlling circuit means including first capacitor means connected between said base and emitter electrodes and second capacitor means connected between said emitter and collector electrodes, circuit means including a piezoelectric crystal and third capacitor means connected in parallel with said first and second capacitor means, at least one of said first and second capacitor means having a temperature coefficient for compensating for the linear variation in the frequency of the crystal with temperature, and means cooperating with said third capacitor means for compensating for the variation in frequency of said crystal with temperature at the edges of a temperature range.

2. An oscillator in accordance with claim 1 wherein said piezoelectric crystal has a negative temperature coefficient over the operating temperature range and each of said first and second capacitor means has a negative temperature coefficient over such portion of the temperature range.

3. An oscillator in accordance with claim 1 wherein said third capacitor means includes first and second capacitor devices connected in parallel with each other and in series with said piezoelectric crystal, said first capacitor device being manually adjustable to control the normal frequency of oscillation and said second capacitor device having a value varying with the voltage applied thereto, and means responsive to changes in temperature for applying a varying voltage to said second device for compensating the variation in frequency of the crystal with temperature over a particular temperature range.

4. An oscillator in accordance with claim 1 wherein said third capacitor means includes first and second capacitor devices connected in parallel with each other and in series with said piezoelectric crystal, said first capacitor device being manually adjustable to control the normal frequency of oscillation and said second capacitor device having a value varying with the voltage applied thereto, and first and second means responsive to changes in temperature for applying varying voltages to said device for compensating the variation in frequency of the crystal with temperature in first and second temperature ranges respectively.

5. An oscillator in accordance with claim 1 including an emitter follower stage coupled to said transistor for isolating said transistor from the load so that the frequency does not vary with changes in the load.

References Cited

UNITED STATES PATENTS

| | | | |
|---|---|---|---|
| 3,054,966 | 9/1962 | Etherington | 331—66 |
| 3,176,244 | 3/1965 | Newell et al. | 331—116 |
| 3,200,349 | 8/1965 | Bangert | 331—176 |
| 3,256,496 | 6/1966 | Angel | 331—116 |

FOREIGN PATENTS

| | | |
|---|---|---|
| 1,011,079 | 6/1957 | Germany. |
| 1,020,080 | 2/1966 | Great Britain. |

OTHER REFERENCES

Gray: Wireless World, "Frequency Stabilization of Oscillators," pp. 219, 220, May 1956.

JOHN KOMINSKI, *Primary Examiner.*

ROY LAKE, *Examiner.*